US006377062B1

(12) United States Patent
Ramos et al.

(10) Patent No.: US 6,377,062 B1
(45) Date of Patent: Apr. 23, 2002

(54) FLOATING INTERFACE FOR INTEGRATED CIRCUIT TEST HEAD

(75) Inventors: Carlos Ramos; Richard Wong, both of San Jose; Sidney Peng, Sunnyvale; David Collins, San Jose, all of CA (US); David Baker, Hillsboro, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/539,361

(22) Filed: Mar. 31, 2000

Related U.S. Application Data (60) Provisional application No. 60/190,146, filed on Mar. 17, 2000.

(51) Int. Cl.⁷ .............................. G01R 31/02
(52) U.S. Cl. ................. 324/758; 324/754; 324/760
(58) Field of Search .................. 324/754, 760, 324/755, 761, 757, 758, 72.5, 73.1, 725, 158.1; 439/71

(56) References Cited

U.S. PATENT DOCUMENTS

| | | | | |
|---|---|---|---|---|
| 4,774,462 A | * | 9/1988 | Black | |
| 5,177,436 A | * | 1/1993 | Lee | |
| 5,355,079 A | * | 10/1994 | Evans | |
| 5,493,237 A | * | 2/1996 | Volz | |
| 5,917,329 A | * | 6/1999 | Cadwallader | |
| 6,049,217 A | * | 4/2000 | Viswanath | |

\* cited by examiner

Primary Examiner—Michael J. Sherry
Assistant Examiner—Trung Q. Nguyen
(74) Attorney, Agent, or Firm—John Smith-Hill; Smith-Hill and Bedell (57) ABSTRACT

A floating interface assembly provides signal paths between an integrated circuit (IC) test head and contact pads on a load board or probe card accessing an IC to be tested. Pogo pins or other contactors for contacting the contact pads are mounted on the interface assembly and linked to the test head by flexible conductors. The interface assembly is attached to the test head by springs to allow it the freedom to rotate to some extent about any axis. As the test head approaches the contact pads, alignment pins engage and orient the interface assembly so that its contactors will mate with the contact pads. As the contactors come into contact with the contact pads, the interface assembly adjusts the plane of the contactors so as to evenly distribute contact pressure over all contactor pads.

28 Claims, 6 Drawing Sheets

FLOATING INTERFACE FOR INTEGRATED CIRCUIT TEST HEAD

CROSS-REFERENCE TO RELATED APPLICATION

This application claims benefit of Provisional Application No. 60/190,146 filed Mar. 17, 2000 entitled FLOATING INTERFACE FOR INTEGRATED CIRCUIT TEST HEAD, the entire disclosure of which is hereby incorporated by reference herein.

BACKGROUND OF THE INVENTION

1. Field of the Invention

The present invention relates in general to systems for aligning the test head of an integrated circuit tester with an integrated circuit device under test (DUT) and in particular with a floating interface for a test head.

2. Description of Related Art

An integrated circuit (IC) tester tests an IC device such as a packaged IC or a die on an IC wafer by transmitting test signals to the device under test (DUT) and monitoring the output signal the DUT produces in response to the test signals. A IC tester includes a separate channel for each input/output (I/O) terminal or test point of the DUT, with each channel being capable of generating and transmitting a test signal to a corresponding DUT terminal or receiving and processing a DUT output signal produced at that terminal. The tester channels are typically implemented on circuit boards mounted in a relatively large chassis called a "test head". While a DUT usually has a large number of input/output (I/O) terminals or test points concentrated into a small area, the I/O ports of the channels within a test head are distributed over a much larger area. Therefore a test system must include some type of interface assembly capable of interconnecting the DUT and the test head I/O ports.

Typically a packaged IC to be tested is mounted on a printed circuit board called a "load" board having a set of pads on its surface that are conductively linked by traces on the load board to the terminals of the IC. When die on a semiconductor wafer are to be tested, a "probe card" provides a set of probes to access test points on the die. A typical probe card will also have a set of pads on its surface that are linked to the probes through traces or other conductors. In either case, an interface assembly is provided to link the tester's I/O ports to the pads on the surface of the load board or probe card.

An interface assembly, typically attached to the test head, includes a set of pogo pins or other resilient contactors to contact with the pads when the test head and load board or the probe card are brought together. Various types of conductors are used to link the tester I/O ports to the pogo pins.

To provide a good connection between all pogo pins and the pads on the probe card or load board, the pogo pin tips and the contacts must be properly aligned as they are brought into contact. Assuming the pads lie in some X,Y plane, the pogo pin tips must also reside in a plane parallel to the X,Y plan as they are brought into contact with the pads so that they will make contact with substantially equal force. Also the pogo pin tips must be in the proper rotational angle ("theta") about a (Z) axis perpendicular to the X,Y plane of the contact pads, and be properly positioned in X and Y directions within that plane in order to properly align with the pads.

Hence the test head must be rotated about the Z ("theta rotated") to achieve the proper theta angle and rotated ("twisted") about some axis in the X,Y plane to position the plane of the probe tips parallel to the plane of the contacts. And finally the test head must be moved along the Z axis to a position where the probe tips come into contact with the load board or probe cards pads with proper force.

One problem with this approach is the test head can be quite massive, for example 500 pounds or more. Fine position adjustments of such a large mass are difficult to achieve. Since the massive test head has much inertia, relatively large forces must be applied to move it into position with reasonable speed, and the stresses involved with using large forces to move a massive object take their toll on parts.

Other structural factors also contribute to the difficulty of making proper alignment of the test head. A test head is usually mounted on a yoke permitting it to be twisted about only one axis in the X,Y plane. This limits our ability to adjust the plane of the pogo pin tips. Also the X axis about which the head can rotate passes through or near the center of gravity of the test head rather than through the contact pads, thereby making the movements needed for precise alignment complicated.

What is needed is a system for quickly and accurately aligning pogo pins or other contactors of an integrated circuit test head with pads or other contacts on a load board or probe card holding an integrated circuit device under test so that they make proper contact with one another.

SUMMARY OF THE INVENTION

A floating interface assembly in accordance with the invention provides signal paths between an integrated circuit (IC) test head and contact pads on a load board or probe card mounted on a platform adjacent to the test head. The load board or probe card includes conductors linking the contact pads to test points on the IC to be tested. Pogo pins or other contactors having tips for contacting the contact pads are mounted on the interface assembly and linked to the test head by flexible conductors.

In accordance with a first aspect of the invention, the interface assembly is attached to the test head by springs to allow it the freedom to move to some extent in any direction with respect to the test head and to rotate to some extent about any axis.

In accordance with a second aspect of the invention, as the test head approaches the contact pads, alignment pins mounted on the platform holding the load board or probe card engage bushings on interface assembly and orient the interface assembly so that its contactors will mate with the contact pads. As the contactors begin to contact the contact pads, the interface assembly adjusts the plane of the contactor tips so as to evenly distribute contact pressure over all contactors.

In accordance with a third aspect of the invention, the interface assembly includes a base plate connected by springs to the test head, a retainer plate for holding the contactors, and a hydraulic piston linking the base plate to the retaining plate. After the test head moves the interface assembly close to the contact pads, the hydraulic piston pushes the retainer plate away from the base plate so that the contactors make contact with the contact pads.

It is accordingly an object of the invention to provide an interface assembly for contacting contact pads linked to test points on an integrated circuit and for providing signal paths between those contact pads and test circuits within an integrated circuit tester.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

FIGS. 1–4 are sectional elevation views of a floating interface assembly 10 in accordance with the invention for helping interconnect test circuits implemented on pin cards 12 mounted with an integrated circuit (IC) tester's test head 13 with one or more integrated circuits 14 to be tested. FIG. 5 is a plan view of a base plate of the floating interface assembly of FIGS. 1–4 and FIG. 6 is a perspective view of portions of the floating interface assembly of FIGS. 1–4.

Referring to FIGS. 1–6, the packaged IC 14 is installed in a socket 15 on an underside of a printed circuit board ("load board") 16 residing on a carrier platform 17 mounted adjacent to test head 13 on a conventional IC handler (or prober) 18. For simplicity, only one IC 14 is shown mounted on load board 16, but several ICs to be tested concurrently may be mounted together on a single load board 16.

During a test, tester channels implemented on pin cards 12 transmit test signals to IC 14 and monitor output signals produced by IC 14 to determine whether the IC is behaving as expected. Printed circuit board traces on each pin card 12 providing paths for these signals terminate at an end 20 of the pin card extending downward through a slot 22 in a lower plate 24 of test head 13. Floating interface assembly 10 includes a retainer plate 28 holding a set of retainer blocks 30, and each retainer block 30 in turn holds a set of downward-pointing pogo pins 32 for contacting pads 34 on the surface of load board 16. Traces (not shown) on load board 16 link pads 34 to terminals of socket 15 holding IC 14. A set of coax cables 36 extending between an edge connector 38 attached to each pin card end 20 and pogo pin retainer block 30 provide signal paths between pogo pins 32 and the traces on pin cards 12 leading to tester channels residing on the pin cards.

Figure 7:
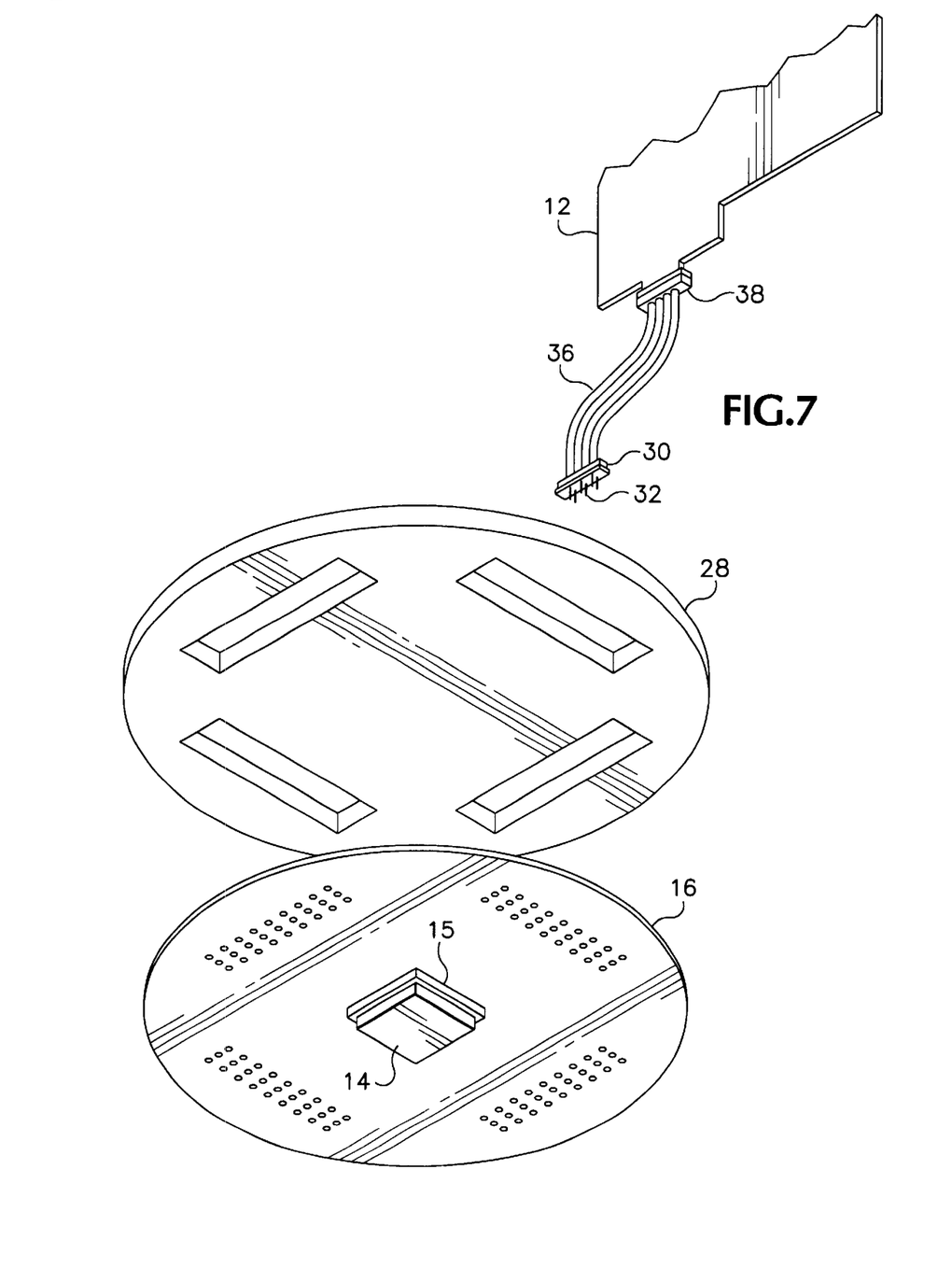
FIG. 7 is a simplified exploded perspective view illustrating signal paths though the floating point interface assembly.

As best seen in FIG. 7, a test signal generated in one of pin cards 12 travels downward to an end 20 of the pin card, through one of coax cables 36, to a pogo pin 32, through the pogo pin to a contact pad on load board 16, and through a trace on load board 16 to a terminal of IC 14 residing in socket 15. An IC 14 output signal follows the path in opposite direction to reach a test circuit implemented on a pin card 12.

The invention relates in particular to interface assembly 10, which holds retainer plate 28 adjacent to the test head. One of the functions of interface assembly 10 is to bring pogo pins 32 into precise alignment with pads 34 as pogo pins 32 are moved so that all pogo pins 32 contact corresponding pads 34 with substantially equal pressure. To do that it is necessary for interface assembly 10 to orient retainer plate 28 so that the tips of all pogo pins 32 lie in a plane parallel to the plane of pads 34 and so that pins 32 are properly positioned within that plane, and not shifted within the plane or rotated about Z axis 47.

Since test head 13 is a relatively massive structure having a center of mass distant from pads 34, it is difficult to precisely and quickly adjust the position of pogo pins 32 by adjusting the position of the entire test head 13 relative to the plane of pads 34. However, as described below, interface assembly 10 is not rigidly attached to test head 13, but is instead linked to interface 10 through a set of springs arranged to give it the freedom it needs to move in any direction as needed to compensate for any misalignment in the orientation of test head 13 relative to the plane of pads 34. Since interface assembly 10 is relatively low mass and has a center of mass very near pins 32 and pads 34, interface assembly 10 can quickly adjust its position as pins 32 near pads 34.

Figure 4:
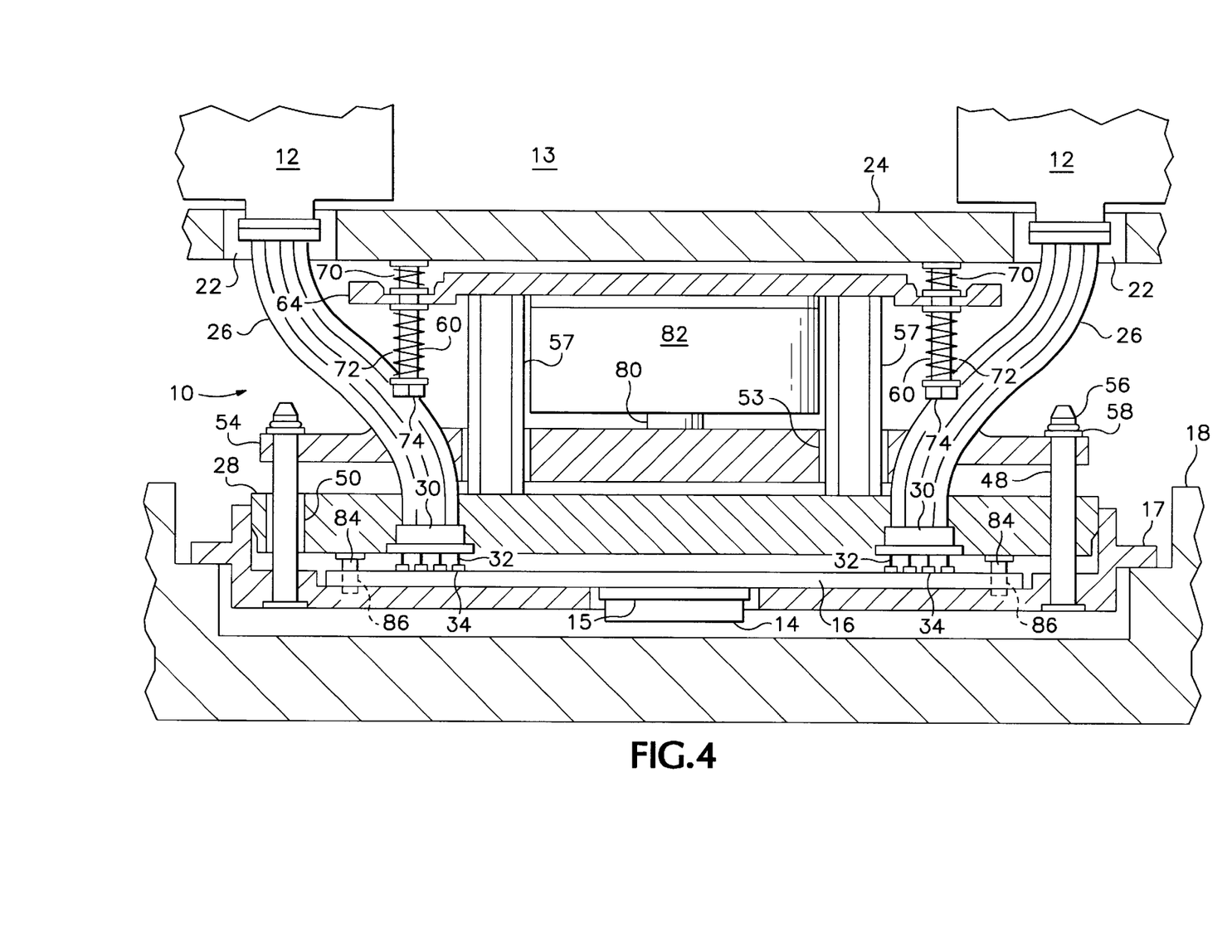
Figures 5, 6:
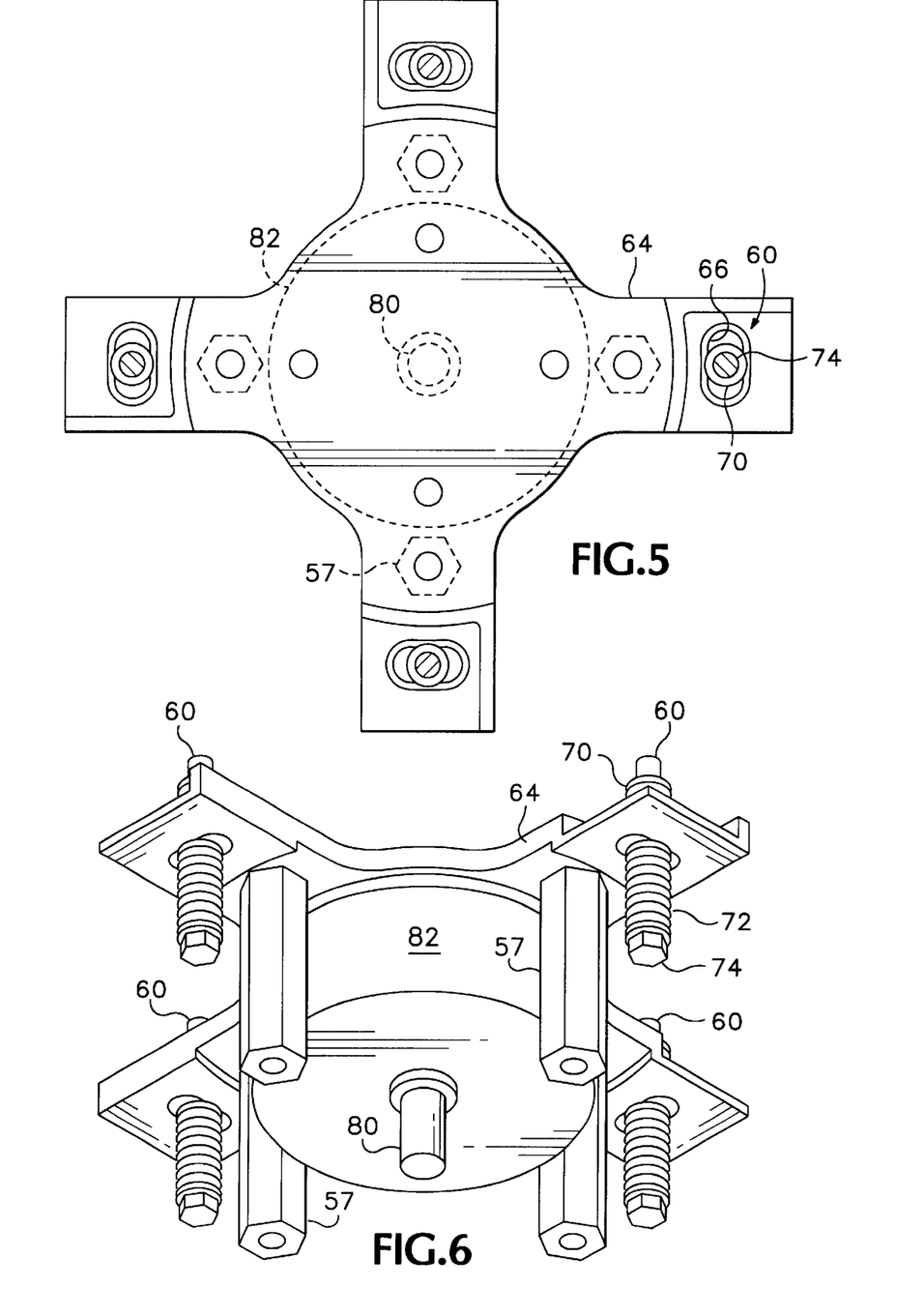
FIG. 5 is a plan view of a base plate of the floating interface assembly of FIGS. 1–4.
FIG. 6 is a perspective view of portions of the floating interface assembly of FIGS. 1–4.

As best seen in FIG. 4, the spring assembly linking interface assembly 10 to test head 13 includes a set of four mounting posts 60 extending downward from test head base plate 24. A base plate 64 of interface assembly 10 has a corresponding set of elongated slots 66, and the base plate 64 is mounted adjacent to test head base plate 24 with posts 60 passing though slots 66. Base plate 64 is held in place on each post 60 by an upper spring 70 extending between plates 24 and 64 and a lower spring 72 extending between plate 64 and a head 74 of the post 60. Thus retainer plate 28, retainer block 30, posts 57 and base plate 64 comprises a "floating" support structure for holding contactors (pogo pins) 32, and springs 70 and 72 flexibly link that floating support structure to test head base plate 24. Since it floats with respect to test head 10, the support structure holding pogo pins 32 has substantial freedom to move relative to test head 13. It is free to rotate to some extent about any axis passing through it, including the test head's Z axis 47, thereby allowing it to properly orient pogo pins 32 to mate with pads 34 as the pogo pins approach the contact pads.

Figure 1:
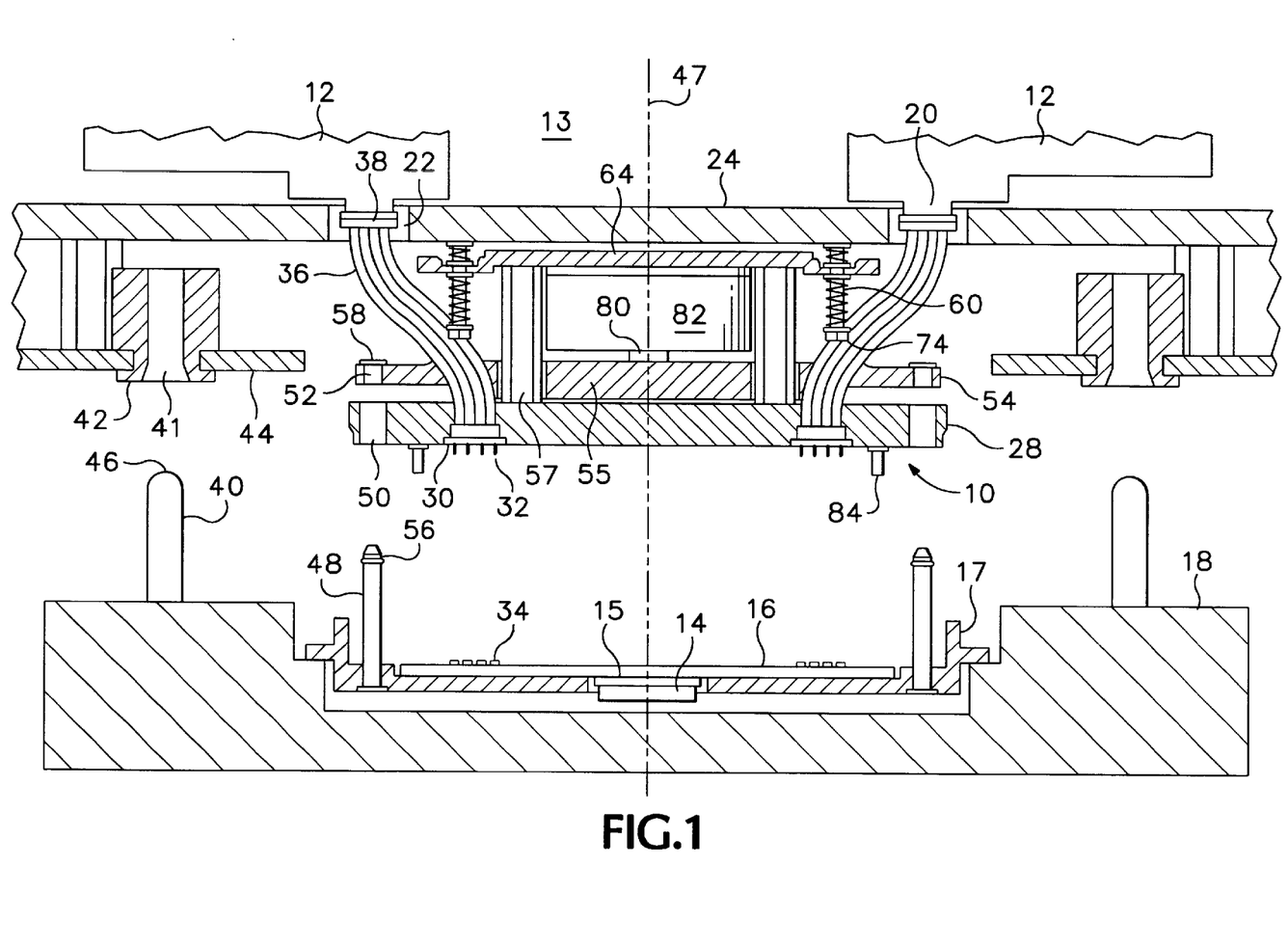
FIGS. 1–4 are sectional elevation views of a test head accessing an integrated circuit via a floating interface assembly in accordance with the invention.

FIGS. 1–4 illustrate how the interface assembly 10 orients itself as test head 13 lowers the interface assembly 13 toward load board 16. FIG. 1 shows interface assembly 10 and test head 13 in a position allowing handler 18 to move load board 16 into place adjacent to interface assembly 10. Thereafter, as test head 13 moves toward load board 16, a set of alignment pins 40 mounted on handler 18 engage channels 41 in a corresponding set of alignment bushings 42 mounted on a docking plate 44 attached to the test head's base plate 24. Test head 13 itself has some freedom to rotate about its Z axis 47, and as the rounded heads 46 of alignments pins 40 enter channels 41, they adjust the test head's angular position about axis 47 as necessary to position a another set of channels 50 in retainer plate 28 so that they can engage a set of upwardly extending alignment pins 48 mounted on carrier platform 17.

Figure 2:
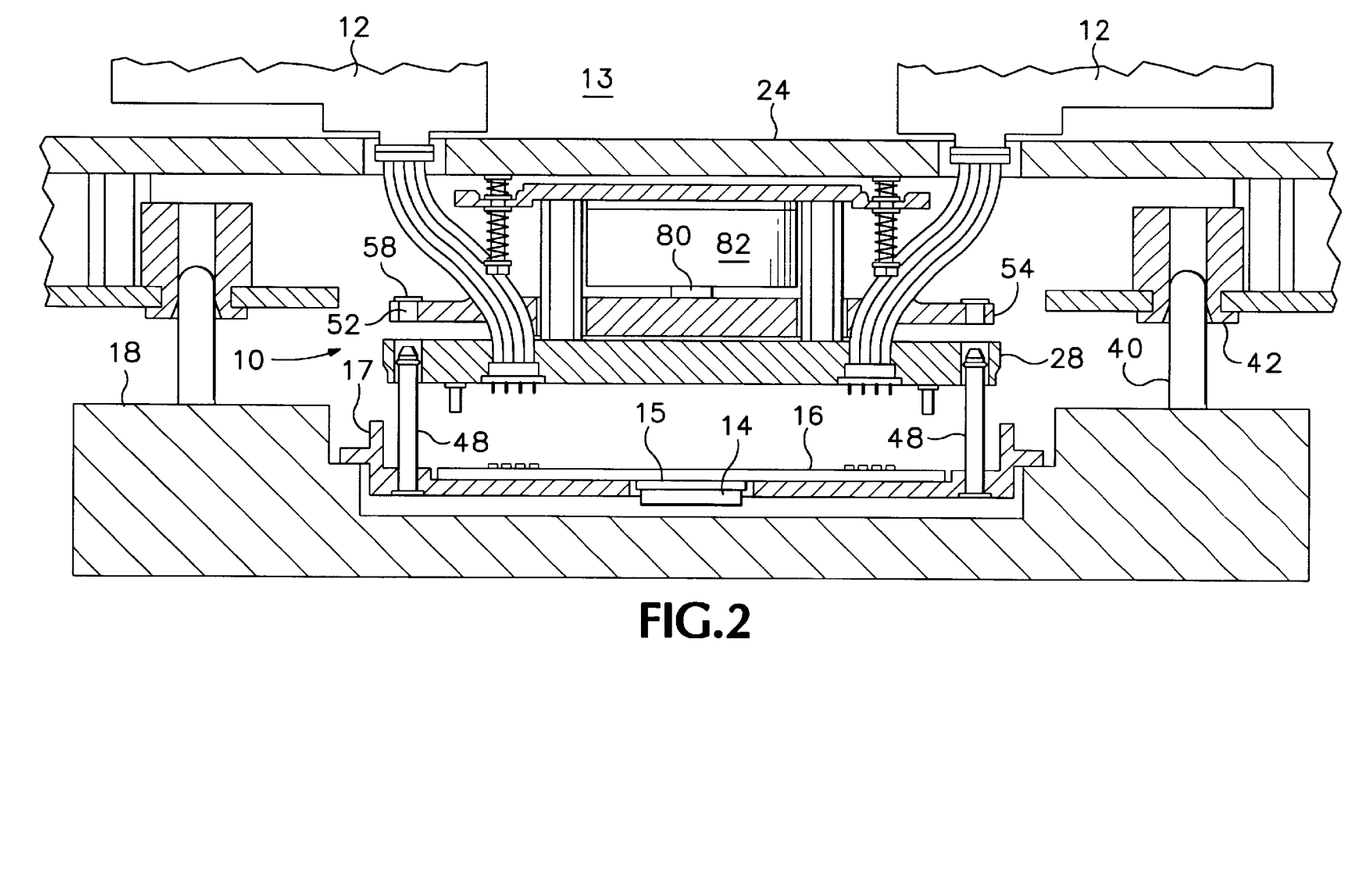

As the test head 13 continues to move toward load board 16, as shown in FIG. 2, each alignment pin 48 passes into a channel 50 in retainer plate 28, thereby slightly rotating the floating interface assembly 10 about Z axis 47 as necessary to precisely align pogo pins 32 with contact pads 34. Each alignment pin 48 then passes through a slot 52 in a "pull-down arm" 54 extension of pull-down plate 55 directly above channel 50. The head 56 of each alignment pin 48 then engages a spreader pin 58 mounted on slot 52. At the same time small alignment pins 84 mounted on retainer plate 28 engage alignment holes 86 in load board 16 to further adjust the position of floating interface assembly 10 so as to finely align pins 32 with contact pads 34.

Figure 3:
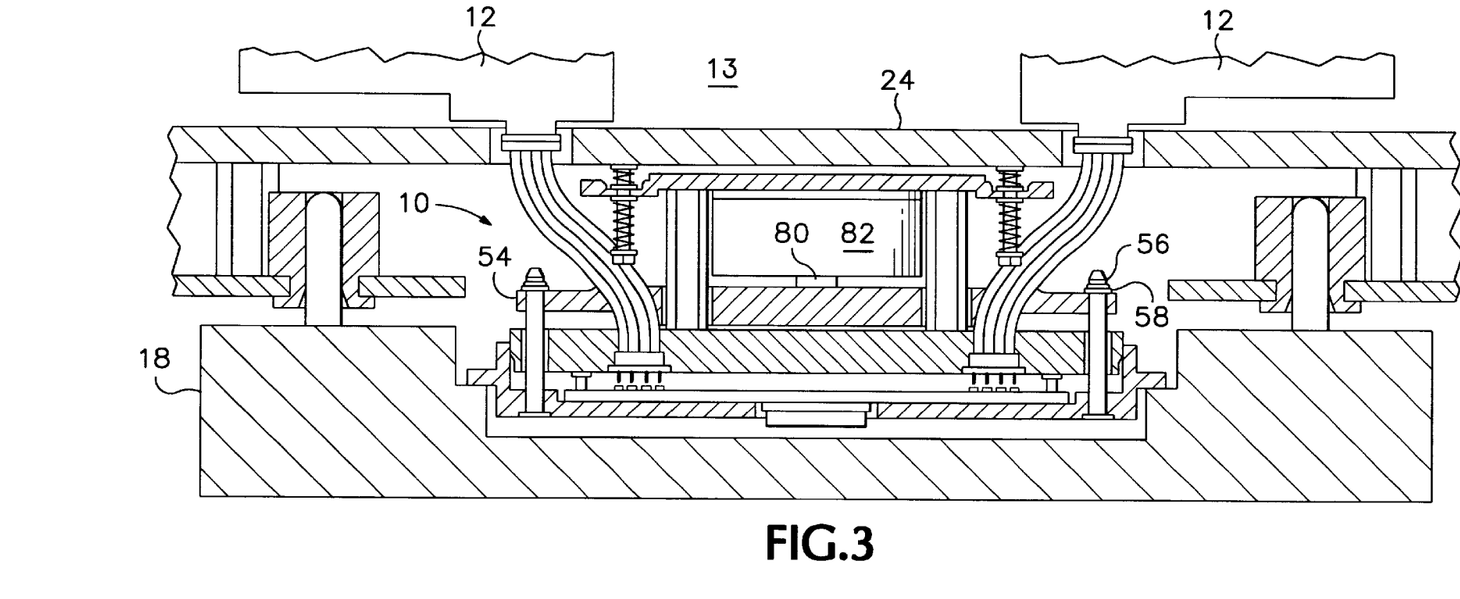

Retainer plate 28 is rigidly attached to base plate 64 via a set of four posts 57 passing though apertures 53 in pull-down plate 55. Pull-down plate 55 is attached to a piston 80 of a pneumatic cylinder 82 mounted on base plate 64. When test head 13 has been positioned so that spreader pins 58 grasp the heads 56 of alignment pins 48, pogo pins 32 are close to pads 34 but not yet touching them, as illustrated in FIG. 3. Test head 13 then stops moving downward. At this point pneumatic cylinder 82 is actuated so as to retract piston 80, thereby applying opposing forces on pull-down plate 55 and alignment pins 56. Since arms 54 of pull-down pate 55 are restrained from moving by spreader pins 58 and alignment pints 48, these opposing forces move interface assembly base plate 64 along posts 60 in a direction toward load board 16 and away from test head 13, compressing lower springs 72 and extending upper springs 70. As it moves along posts 60, base plate 64 pushes posts 57, retainer plate 28 and pogo pins 32 toward load board 16, thereby bringing pogo pins 32 into contact with contact pads 34, as illustrated in FIG. 4. As pogo pins 32 come into contact with pads 34, floating interface assembly 10 may wobble as necessary to place pogo pins 32 in the same plane as pads 34 so that all pogo pins 32 contact corresponding pads 34 with substantially similar pressure.

After the tester tests IC 14, pneumatic cylinder 82 extends piston 80 outward to push on pull-down plate 55 in a direction toward load board 16 thereby releasing pressure between pogo pins 32 and pads 34. Test head 13 then moves away from load board 16 pulling pull-down plate 55 with enough pressure to cause spreader pins 58 to release alignment pins 48, as illustrated in FIG. 2. Test head 13 then continues to move interface assembly 10 away from load board 16 until it reaches the position as illustrated in FIG. 1. Handler 18 may then replace load board 16 with another load board containing a next IC to be tested.

Thus has been shown and described a floating interface assembly in accordance with the present invention for precisely aligning pogo pins 32 with contact pads 34. While the forgoing specification has described preferred embodiment(s) of the present invention, one skilled in the art may make many modifications to the preferred embodiment without departing from the invention in its broader aspects. For example, IC being tested may be one or more die on a semiconductor wafer, and in such case the wafer would be held by a "wafer prober" instead of a handler as shown, and load board 16 would be replaced by a probe card having probes for accessing test points on the die. Those probes would be linked to pads the surface of a probe card serving the same function as pads 34 on the surface of load board 16. Thus a similar floating interface assembly 10 could be used to access pads on a probe board when die on an IC wafer are being tested. The appended claims therefore are intended to cover all such modifications as fall within the true scope and spirit of the invention.

What is claimed is:

1. For an integrated circuit tester having a test head containing tester channels for testing an integrated circuit mounted on a platform and conductively linked to a plurality of contact pads, an apparatus for providing signal paths between said tester channels and said contact pads, the apparatus comprising:

contactors for contacting said contact pads;
   conductive means for linking said contactors to said tester channels;
   support means for holding said contactors;
   resilient means linking said support means to the test head while allowing said support means substantial freedom to move relative to said test head;
   an alignment pin mounted on said platform, said support means including an aperture through which said alignment pin extends; and
   means for moving said support means along said alignment pin toward said platform and away from said test head such that said contactors contact said contact pads.

2. The apparatus in accordance with claim 1 wherein said resilient means comprises a spring connected between said support means and said test head.

3. The apparatus in accordance with claim 1 wherein said means for moving said support means pulls on said alignment pin applies opposing forces on said support means and said alignment pin to move said support means along said alignment pin.

4. The apparatus in accordance with claim 3 wherein said means for moving said support means comprises a hydraulic cylinder.

5. The apparatus in accordance with claim 1 wherein said contact pads are arranged in a plane substantially perpendicular to an axis, wherein said test head approaches said contact pads substantially along said axis and wherein said resilient means allows said support means substantial freedom to rotate about said axis.

6. For an integrated circuit tester having a test head containing tester channels for testing an integrated circuit (IC) mounted on a platform and conductively linked too a plurality of contact pads, an apparatus for providing signal paths between said tester channels and said contact pads, the apparatus comprising:

a plurality of mounting posts attached to said test head, each mounting post having a head end spaced from said test head;
   a base plate having a plurality of slots therein, each of said mounting posts extending through a corresponding one of said slots; and
   resilient means for linking said base plate to said posts, said resilient means permitting said base plate substantial freedom to move relative to said test head while said mounting posts extend through said slots.

7. The apparatus in accordance with claim 6 wherein said resilient means comprises:

a plurality of upper springs, each mounted on a separate one of said mounting posts and residing between said test head and said base plate; and
   a plurality of lower springs, each mounted on a separate one of said mounting posts and residing between said base plate and the head end of the mounting post on which it is mounted.

8. The apparatus in accordance with claim 6 further comprising:

a plurality of contactors, each for contacting a separate one of said plurality of contact pads;
   a retainer plate for holding said contactors, and
   means for attaching said retainer plate to said base plate.

9. The apparatus in accordance with claim 8 further comprising:

a first alignment pin mounted on said platform,
   a pull-down plate having a first aperture therein for receiving said first alignment pin, grasping means for grasping said first alignment pin and linking it to said pull-down plate when received by said first aperture, and means for coupling said pull-down plate to said base plate and for flexibly adjusting a distance between said pull-down plate and said base plate.

10. The apparatus in accordance with claim 9 wherein when said first alignment pin is received by said first aperture and grasped by said grasping means, and said means for coupling decreases said distance between said pull-down plate and said base plate, said contactors move into contact with said contact pads.

11. The apparatus in accordance with claim 10 further comprising:
  a second alignment pin mounted on said platform in fixed relation to said contact pads, and
  an alignment bushing connected to said test head for receiving said second alignment pin.

12. The apparatus in accordance with claim 11 further comprising:
  a load board mounted on said platform for holding said IC and said contact pads and including a second aperture therein; and
  a third alignment pin mounted on said retainer plate for engaging said second aperture.

13. The apparatus in accordance with claim 9 wherein said means for coupling said pull-down plate to said base plate and for flexibly adjusting a distance between said pull-down plate and said base plate comprises a piston and a cylinder coupled between said pull-down plate, wherein said cylinder moves said piston so as to flexibly adjust said distance between said base plate and said pull-down plate.

14. The apparatus in accordance with claim 6 wherein said slots are sufficiently larger than said mounting posts to provide said base plate substantial freedom to rotate about an axis passing through said test head.

15. For an integrated circuit tester having a test head containing tester channels for testing an integrated circuit (IC) mounted on a platform, wherein the IC has test points conductively linked to a plurality of contact pads arranged in a plane substantially perpendicular to an axis, an apparatus for providing signal paths between said tester channels and said contact pads when said test head approaches said contact pads substantially along said axis, the apparatus comprising:
  a plurality of mounting posts attached to and extending from said test head, each mounting post having a head end spaced from said test head;
  a base plate having a plurality of slots therein, each of said mounting posts extending through a corresponding one of said slots;
  a plurality of upper springs, each mounted on a separate one of said mounting posts and residing between said test head and said base plate;
  a plurality of lower springs, each mounted on a separate one of said mounting posts and residing between said base plate and the head end of the mounting post, wherein said upper and lower springs support said base plate;
  a plurality of contactors, each for contacting a separate one of said plurality of contact pads;
  a retainer plate for holding said contactors; and
  means for attaching said retainer plate to said base plate.

16. The apparatus in accordance with claim 15
  wherein said axis passes through said base plate, and
  wherein said slots of said base plate are elongate and permit said base plate substantial freedom to rotate about said axis.

17. The apparatus in accordance with claim 15 further comprising:
  a first alignment pin mounted on said platform in fixed relation to said contact pads,
  a pull-down plate having a first aperture therein for receiving said first alignment pin as said test head approaches said contact pads,
  means for grasping said first alignment pin when received said first aperture, and
  means for coupling said pull-down plate to said base plate and for flexibly adjusting a distance between said pull-down plate and said base plate.

18. The apparatus in accordance with claim 17 wherein said means for coupling said pull-down plate to said base plate and for flexibly adjusting a distance between said pull-down plate and said base plate comprises:
  a piston linked to said pull-down plate, and
  a cylinder linked to said base plate for moving said piston so as to adjust said distance between said base plate and said pull-down plate.

19. The apparatus in accordance with claim 18 further comprising:
  a second alignment pin mounted on said platform, and
  an alignment bushing connected to said test head for receiving said second alignment pin as said test head approaches said contact pads.

20. The apparatus in accordance with claim 18 further comprising:
  a load board mounted on said platform for holding said IC and said contact pads and including a second aperture therein; and
  a third alignment pin mounted on said retainer plate for engaging said second aperture.

21. An apparatus for testing an integrated circuit (IC) having a plurality of test points, the apparatus comprising:
  a test head for moving along an axis and having test channels for testing said IC,
  a platform,
  means mounted on said platform for holding said IC and including a plurality of contact pads conductively linked to said test points and arranged in a plane substantially perpendicular to said axis,
  a plurality of mounting posts attached to and extending from said test head, each mounting post having a head end spaced from said test head;
  a base plate having a plurality of slots therein, said base plate being mounted on said mounting posts such that each said mounting post extends through a corresponding one of said slots;
  resilient means for linking said base plate to said posts, said resilient means permitting said base plate substantial freedom to move relative to said test head while said mounting posts extend though said slots;
  a plurality of contactors, each for contacting a separate one of said plurality of contact pads;
  a retainer plate for holding said contactors; means for attaching said retainer plate to said base plate;
  means for providing signal paths between said tester channels and said plurality of conductive contactors.

22. The apparatus in accordance with claim 21 wherein said resilient means comprises:
  a plurality of upper springs, each mounted on a separate one of said mounting posts and residing between said test head and said base plate; and a plurality of lower springs, each mounted on a separate one of said mounting posts and residing between said base plate and the head end of the mounting post upon which it is mounted, such that said upper and lower springs support said base plate.

23. The apparatus in accordance with claim 22 wherein said axis passes through said base plate, and wherein said slots of said base plate permit said base plate substantial freedom to rotate about said axis.

24. The apparatus in accordance with claim 22 further comprising:

a first alignment pin mounted on said platform, a pull-down plate having a first aperture therein for receiving said first alignment pin, grasping means for grasping said first alignment pin and linking it to said pull-down plate when received by said first aperture, and means for coupling said pull-down plate to said base plate and for flexibly adjusting a distance between said pull-down plate and said base plate.

25. The apparatus in accordance with claim 24 wherein when said first alignment pin is received by said first aperture and grasped by said grasping means, and said means for coupling decreases said distance between said pull-down plate and said base plate, said contactors move into contact with said contact pads.

26. The apparatus in accordance with claim 24 wherein said means for coupling said pull-down plate to said base plate and for flexibly adjusting a distance between said pull-down plate and said base plate comprises a piston and a cylinder coupled between said pull-down plate, wherein said cylinder moves said piston so as to flexibly adjust said distance between said base plate and said pull-down plate.

27. The apparatus in accordance with claim 26 further comprising:

a second alignment pin mounted on said platform in fixed relation to said contact pads, and an alignment bushing connected to said test head for receiving said second alignment pin.

28. The apparatus in accordance with claim 27 further comprising:

a load board mounted on said platform for holding said IC and said contact pads and including a second aperture therein; and a third alignment pin mounted on said retainer plate for engaging said second aperture.

* * * * *